US012777578B2

(12) United States Patent
Zeng et al.

(10) Patent No.: US 12,777,578 B2
(45) Date of Patent: Oct. 27, 2026

(54) FLEXIBLE CIRCUIT BOARD, DISPLAYING MODULE AND DISPLAYING DEVICE

(71) Applicants: Chengdu BOE Optoelectronics Technology Co., Ltd., Chengdu (CN); BOE Technology Group Co., Ltd., Beijing (CN)

(72) Inventors: Wenzhu Zeng, Beijing (CN); Dake Wang, Beijing (CN); Xuefeng Ding, Beijing (CN); Tianma Li, Beijing (CN); Guohui Wang, Beijing (CN); Zhengguang Zhang, Beijing (CN); Wenyuan Liu, Beijing (CN)

(73) Assignees: CHENGDU BOE OPTOELECTRONICS TECHNOLOGY CO., LTD., Chengdu (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 280 days.

(21) Appl. No.: 18/697,407

(22) PCT Filed: Aug. 24, 2023

(86) PCT No.: PCT/CN2023/114577
§ 371 (c)(1),
(2) Date: Mar. 29, 2024

(87) PCT Pub. No.: WO2025/039245
PCT Pub. Date: Feb. 27, 2025

(65) Prior Publication Data
US 2026/0143584 A1 May 21, 2026

(51) Int. Cl.
*H05K 1/02* (2006.01)

(52) U.S. Cl.
CPC . *H05K 1/0277* (2013.01); *H05K 2201/10128* (2013.01)

(58) Field of Classification Search
CPC .. H05K 1/0215; H05K 1/0218; H05K 1/0259; H05K 1/0277; H05K 2207/05;
(Continued)

(56) References Cited

U.S. PATENT DOCUMENTS

2019/0340959 A1* 11/2019 Park .................. G02F 1/133305
2020/0084888 A1* 3/2020 Lee ........................ H05K 1/118
(Continued)

FOREIGN PATENT DOCUMENTS

CN 204422905 U 6/2015
CN 205408268 U 7/2016
(Continued)

*Primary Examiner* — Tuan T Dinh
(74) *Attorney, Agent, or Firm* — WHDA, LLP

(57) ABSTRACT

A flexible circuit board, a displaying module and a displaying device are provided. The flexible circuit board includes a plurality of bendable regions that are arranged in a first direction and are separated from each other, a bending axis of each of the plurality of the bendable regions extends in a second direction, the plurality of bendable regions include a first bendable region, and the flexible circuit board includes: a substrate; a first metal layer located at one side of the substrate and including a first trace region and a second trace region that extend in the first direction and are arranged in the second direction; and a second metal layer located at one side of the substrate away from the first metal layer and including a bending pattern and a first opening that are located within the first bendable region.

19 Claims, 7 Drawing Sheets

(58) Field of Classification Search
CPC .. H05K 2207/2009; H05K 2207/10189; G06F 1/028; G06F 1/1652; G06F 1/189; G06F 3/041; G09F 9/301
USPC ........................ 361/749–750, 792–795, 803; 174/254–262
See application file for complete search history.

(56) References Cited

U.S. PATENT DOCUMENTS

| | | | | |
|---|---|---|---|---|
| 2020/0401197 A1* | 12/2020 | Asada | .................... | H05K 1/118 |
| 2021/0007213 A1* | 1/2021 | Ryu | ........................ | H05K 1/028 |
| 2023/0104812 A1 | 4/2023 | Wang et al. | | |
| 2023/0119129 A1* | 4/2023 | Lee | ...................... | H05K 1/0283 174/254 |
| 2023/0135080 A1* | 5/2023 | Wang | ...................... | G09F 9/301 361/749 |

FOREIGN PATENT DOCUMENTS

| | | | |
|---|---|---|---|
| CN | 108738226 | A | 11/2018 |
| CN | 109240013 | A | 1/2019 |
| CN | 110518039 | A | 11/2019 |
| CN | 211047382 | U | 7/2020 |
| CN | 216146510 | U | 3/2022 |
| CN | 217544093 | U | 10/2022 |
| CN | 218471535 | U | 2/2023 |
| CN | 218976916 | U | 5/2023 |
| CN | 116417470 | A | 7/2023 |

* cited by examiner

FLEXIBLE CIRCUIT BOARD, DISPLAYING MODULE AND DISPLAYING DEVICE

TECHNICAL FIELD

The present disclosure relates to the technical field of displaying and, more particularly, to a flexible circuit board, a displaying module and a displaying device.

BACKGROUND

In conventional displaying modules, in order to reduce the volume and the weight of the entire module, the printed circuit board is usually adhered to the back of the display panel, and connected to the display panel via a flexible circuit board, to realize the signal transmission.

SUMMARY

A flexible circuit board is provided by the present disclosure, wherein the flexible circuit board includes a plurality of bendable regions that are arranged in a first direction and are separated from each other, a bending axis of each of the plurality of bendable regions extends in a second direction, the plurality of bendable regions include a first bendable region, and the flexible circuit board includes:

a substrate;

a first metal layer located at one side of the substrate and including a first trace region and a second trace region that extend in the first direction and are arranged in the second direction; and a second metal layer located at one side of the substrate away from the first metal layer and including a bending pattern and a first opening that are located within the first bendable region;

wherein an orthographic projection on the substrate of the bending pattern and an orthographic projection on the substrate of the first trace region overlap, and an orthographic projection on the substrate of the first opening and an orthographic projection on the substrate of the second trace region overlap.

In some embodiments, a region where an orthographic projection on the substrate of the first bendable region and the orthographic projection on the substrate of the first trace region overlap with each other is located within an area of the orthographic projection on the substrate of the bending pattern.

In some embodiments, the first trace region includes:

a plurality of earthing lines that are separated from each other and extend in the first direction, wherein the plurality of earthing lines and the bending pattern are connected via first via holes.

In some embodiments, the first trace region further includes:

a plurality of first signal lines that are separated from each other and extend in the first direction, each of the plurality of first signal lines is located between two neighboring earthing lines, and at least one of the first signal lines is disposed between the two neighboring earthing lines.

In some embodiments, the plurality of first signal lines include a low-voltage differential-signal line.

In some embodiments, the second metal layer includes two first openings, and the two first openings are located at different sides of the bending pattern.

In some embodiments, the two first openings and the bending pattern are arranged in the second direction, and dimensions in the second direction of the two first openings are unequal.

In some embodiments, the plurality of bendable regions further include a second bendable region, and the second metal layer further includes:

a second opening located within the second bendable region, wherein an orthographic projection on the substrate of the second opening overlaps with both of the orthographic projection on the substrate of the first trace region and the orthographic projection on the substrate of the second trace region.

In some embodiments, a width in the first direction of the bending pattern is greater than a width in the first direction of the second opening, and the width in the first direction of the bending pattern is equal to a width in the first direction of the first opening.

In some embodiments, the first trace region includes:

first leads close to a first side edge of the first trace region and configured for bonding a display panel; and second leads close to a second side edge of the first trace region and configured for bonding a printed circuit board;

wherein the first side edge and the second side edge are two side edges of the first trace region that are opposite to each other in the first direction, and the bending pattern is located at one side of the second bendable region away from the first leads.

In some embodiments, the flexible circuit board further includes a planarizing region located at at least one side of the plurality of bendable regions; and the second metal layer further includes a planarizing pattern located within the planarizing region, the planarizing pattern and the bending pattern are connected to each other and are of an integral structure, and the planarizing pattern is connected to earthing lines in the first metal layer via second via holes.

In some embodiments, the planarizing pattern includes a first conducting pattern configured for connecting to an earth potential; and an orthographic projection on the substrate of the first conducting pattern is located within an area of the orthographic projection on the substrate of the second trace region, and does not overlap with orthographic projections on the substrate of the second via holes.

In some embodiments, the first metal layer further includes second leads configured for bonding a printed circuit board; and the first conducting pattern is located at one side of the plurality of bendable regions that is close to the second leads.

In some embodiments, the second metal layer includes a plurality of first conducting patterns, the plurality of first conducting patterns are located at two sides of the first trace region, and the plurality of first conducting patterns are arranged in the second direction.

In some embodiments, the bending pattern is a grid pattern.

A displaying module is provided by the present application, wherein the displaying module includes:

a display panel, and the flexible circuit board according to any one of embodiments stated above, wherein the first metal layer of the flexible circuit board is bonding-connected to the display panel.

In some embodiments, the displaying module further includes a printed circuit board bonding-connected to the first metal layer of the flexible circuit board;

the plurality of bendable regions further include a second bendable region, and both of the first bendable region and the second bendable region are in a bending state, so that the printed circuit board is located at one side of the display panel away from the light-exiting surface; and a bending radius of the bending pattern is greater than or equal to a bending radius of the second bendable region.

In some embodiments, the second metal layer further includes a first conducting pattern configured for connecting to an earth potential; and the displaying module further includes:

a first conducting adhesive tape, wherein the first conducting adhesive tape is located at one side of the flexible circuit board close to the second metal layer, and an adhesive surface of the first conducting adhesive tape faces the second metal layer; and an insulating film adhesively bonded to the adhesive surface of the first conducting adhesive tape, wherein the insulating film includes an insulating pattern and a third opening, an orthographic projection on the substrate of the insulating pattern covers at least an orthographic projection on the substrate of a first opening and an orthographic projection on the substrate of a second opening, and an orthographic projection on the substrate of the third opening covers an orthographic projection on the substrate of the first conducting pattern.

In some embodiments, the display panel includes a first border frame, and the first metal layer is connected to a lead located inside the first border frame;

the displaying module further includes:

a second conducting adhesive tape, wherein the second conducting adhesive tape is located at one side of the first border frame, and an adhesive surface of the second conducting adhesive tape faces the first border frame; and a third conducting adhesive tape, wherein the third conducting adhesive tape is located at one side of the printed circuit board close to an element component, and an adhesive surface of the third conducting adhesive tape faces the element component;

wherein the first conducting adhesive tape, the second conducting adhesive tape and the third conducting adhesive tape are of an integral structure, the insulating film extends to the adhesive surface of the third conducting adhesive tape, and an orthographic projection on the substrate of the insulating film covers an orthographic projection on the substrate of the element component.

A displaying device is provided by the present embodiment, wherein the displaying device includes:

the displaying module according to any one of embodiments stated above; and a driving component connected to the displaying module and configured for driving the displaying module to display.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly described below. Apparently, the figures that are described below are embodiments of the present disclosure, and a person skilled in the art can obtain other figures according to these figures without paying creative work. It should be noted that the scales in the drawings are merely illustrative and do not indicate the actual scales.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
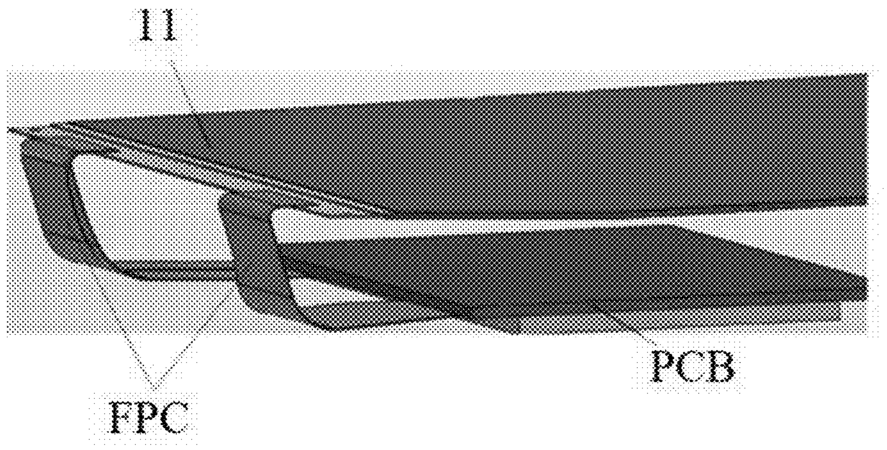
FIG. 1 (Prior Art)
FIG. 1 exemplarily shows a schematic structural diagram of a displaying module in the related art.

In the related art, printed circuit boards (PCB) are usually used as the supporter for the electronic element components and the carrier of the electric interconnection of the electronic element components. As shown in FIG. 1, by adhering the PCB to the back of the display panel 11, the overall volume of the displaying module can be reduced. The display panel 11 and the PCB may be bonding-connected by using a flexible circuit board (FPC), to realize the signal transmission.

In the related art, the design of a single copper layer is usually adopted in the bendable region of the FPC, and the design of double copper layers is usually adopted in the non-bending region. However, the inventor has found that, when the FPCs of such a structure are used to transmit signals, especially low-voltage differential signals, signal instability easily happens, which affects the effect of displaying of the display panel 11.

Figure 2:
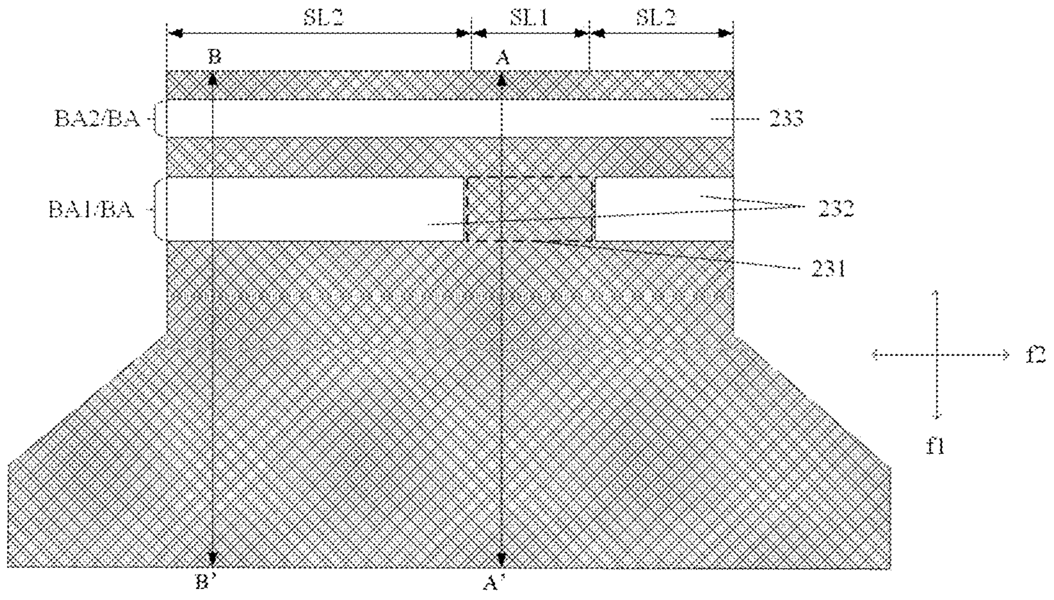
FIG. 2 exemplarily shows a schematic planar structural diagram of a flexible circuit board according to the present disclosure.
Figure 3:
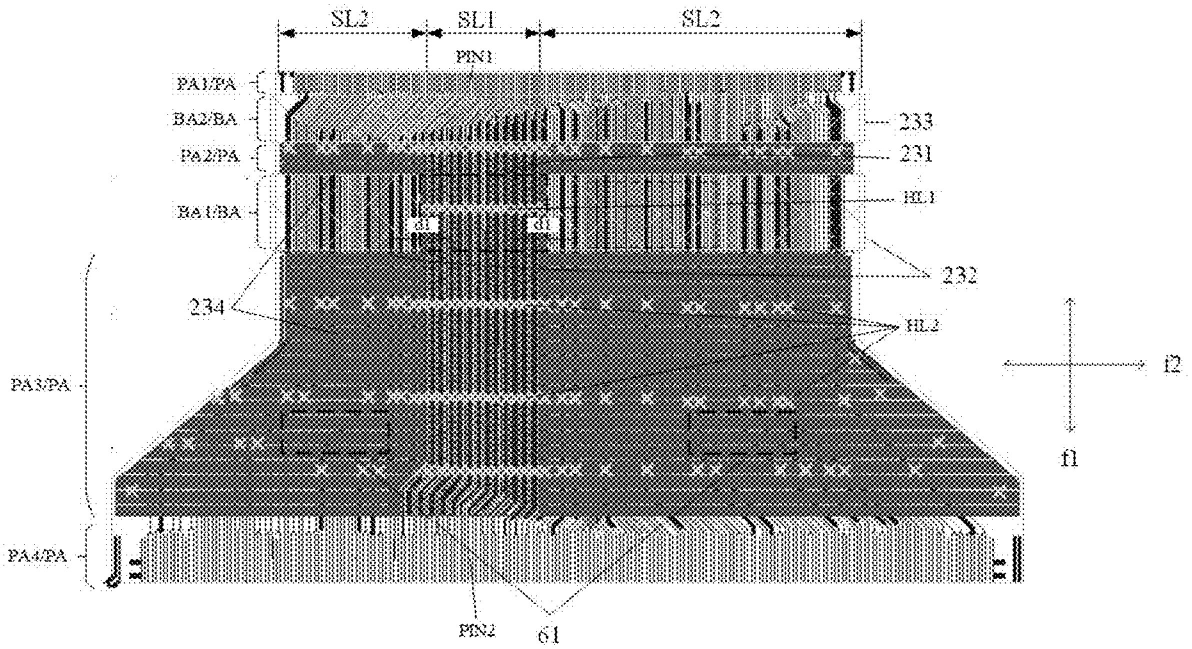
FIG. 3 exemplarily shows a circuit layout diagram of a flexible circuit board according to the present disclosure.
Figure 4:
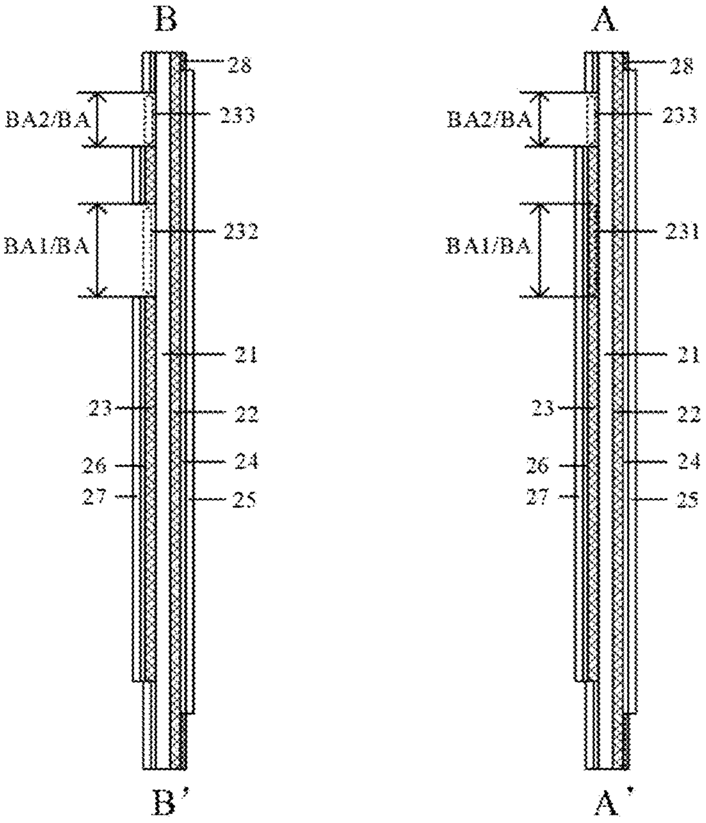
FIG. 4 exemplarily shows a schematic sectional structural diagram of a flexible circuit board according to the present disclosure.

Referring to FIG. 2, FIG. 2 shows a schematic planar structural diagram of a flexible circuit board according to the present disclosure. Referring to FIG. 3, FIG. 3 shows a circuit layout diagram of a flexible circuit board according to the present disclosure. Referring to FIG. 4, FIG. 4 shows a schematic sectional structural diagram of a flexible circuit board according to the present disclosure.

As shown in FIG. 2 or 3, the flexible circuit board includes a plurality of bendable regions BA that are arranged in a first direction f1 and are separated from each other, a bending axis of each of the plurality of bendable regions BA extends in a second direction f2, and the plurality of bendable regions BA include a first bendable region BA1.

As shown in FIG. 4, the flexible circuit board includes: a substrate 21; and a first metal layer 22 located at one side of the substrate 21, and a second metal layer 23 located at the side of the substrate 21 away from the first metal layer 22.

Figure 5:
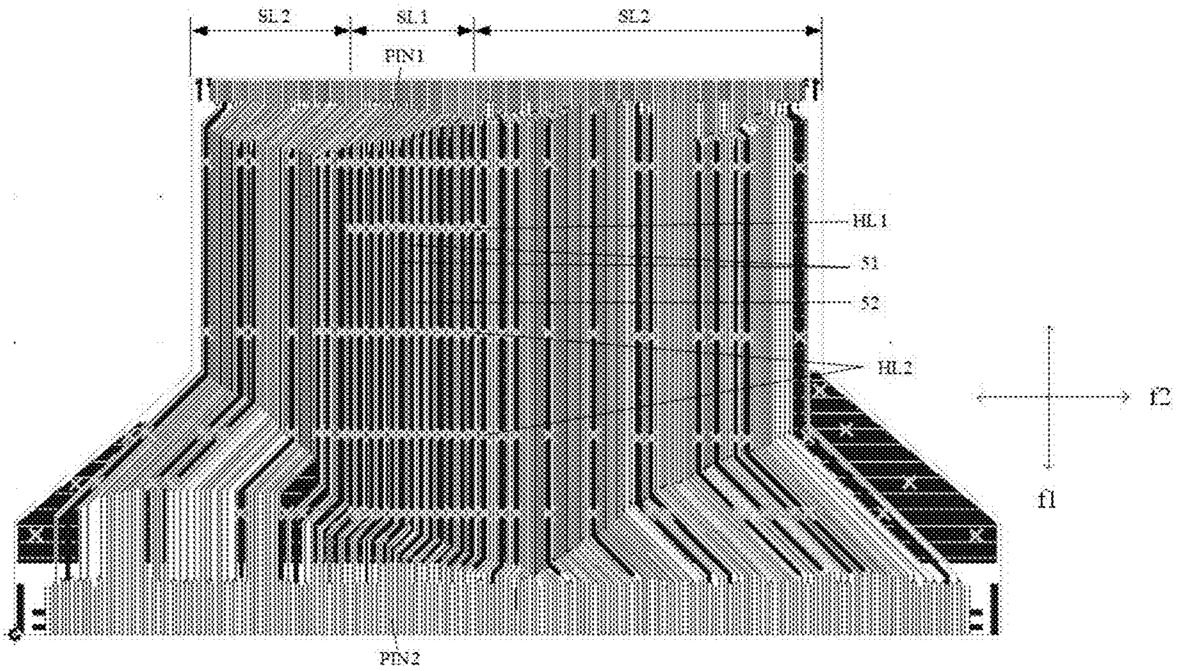
FIG. 5 exemplarily shows a circuit layout diagram of a first metal layer.
Figure 6:
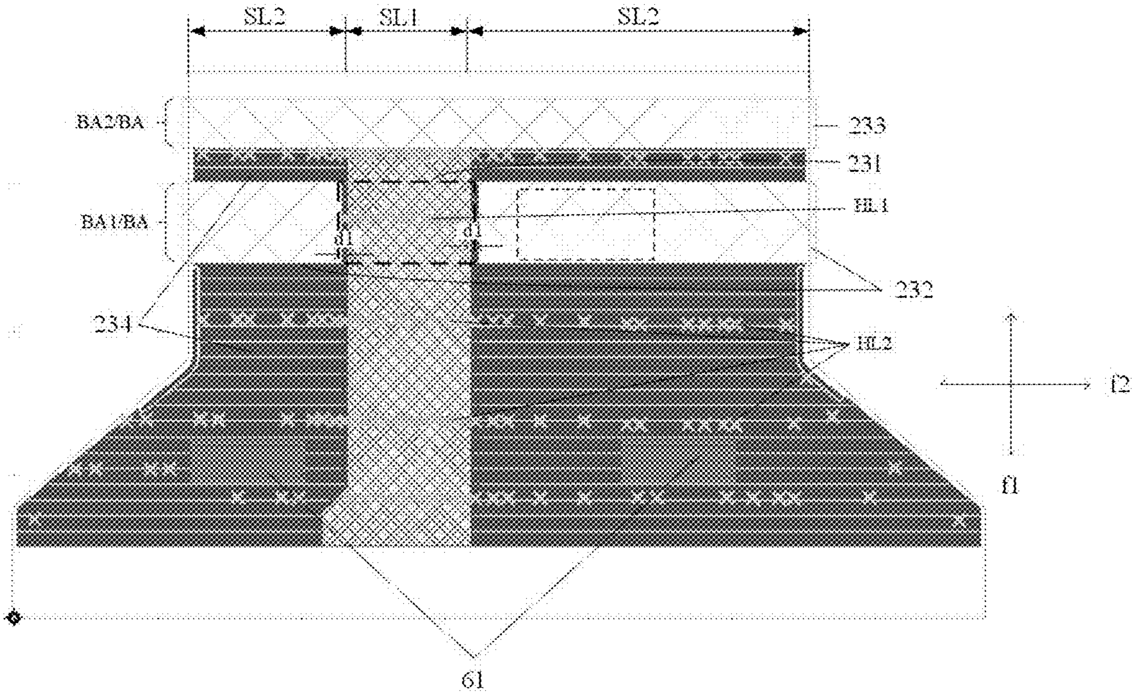
FIG. 6 exemplarily shows a circuit layout diagram of a second metal layer.

Referring to FIG. 5, FIG. 5 shows a circuit layout diagram of a first metal layer. Referring to FIG. 6, FIG. 6 shows a circuit layout diagram of a second metal layer.

As shown in FIG. 2, FIG. 3 or FIG. 5, the first metal layer 22 includes a first trace region SL1 and a second trace region SL2 that extend in the first direction f1 and are arranged in the second direction f2.

As shown in FIG. 2, FIG. 3 or FIG. 6, the second metal layer 23 includes a bending pattern 231 and a first opening 232 that are located within the first bendable region BA1. The orthographic projection on the substrate 21 of the bending pattern 231 and the orthographic projection on the substrate 21 of the first trace region SL1 overlap, and the orthographic projection on the substrate of the first opening 232 and the orthographic projection on the substrate of the second trace region SL2 overlap.

As an example, as shown in FIG. 2 or FIG. 3, the first direction f1 and the second direction f2 are perpendicular to each other.

As shown in FIG. 2 or FIG. 3, in the orthographic projections on the substrate 21, the first trace region SL1 and the second trace region SL2 extend through the bendable regions BA; in other words, the first trace region SL1 overlaps with the bendable regions BA, and the second trace region SL2 overlaps with the bendable regions BA.

As an example, as shown in FIG. 4, the first opening 232 is a through hole that extends throughout the second metal layer 23 in a direction from the substrate 21 pointing to the second metal layer 23.

In the flexible circuit board according to the present disclosure, by disposing the bending pattern 231 within the region where the first bendable region BA1 and the first trace region SL1 overlap, a structure of double copper layers are formed within the overlapping region, the impedance is effectively reduced, and the degree of the impedance matching between the first bendable region and the non-bending region of the traces within the first trace region SL1 can be increased, thereby the stability and the anti-interference performance of the signal transmission in the traces within the first trace region SL1 can be increased, the quality of the signal transmission is increased, and the effect of displaying is improved. By disposing the first opening 232 within the region where the first bendable region BA1 and the second trace region SL2 overlap, a structure of a single copper layer is formed within the overlapping region, which ensures that the first bendable region BA1 still has good flexibility and easy bendability, thereby problems such as light leakage in the black frame that might be caused by the bending can be prevented, and the normal displaying in the bending state is ensured.

As an example, the low-voltage differential-signal line for transmitting a low-voltage differential signal may be disposed within the first trace region SL1, the quality of the transmission of the low-voltage differential signal is improved, and the effect of displaying is improved.

In some embodiments, as shown in FIG. 3, the region where the orthographic projection on the substrate 21 of the first bendable region BA1 and the orthographic projection on the substrate 21 of the first trace region SL1 overlap with each other is located within the area of the orthographic projection on the substrate 21 of the bending pattern 231.

As an example, as shown in FIG. 3, a width in the second direction f2 of the first trace region SL1 is less than a width in the second direction f2 of the bending pattern 231.

As an example, as shown in FIG. 3, in the orthographic projections on the substrate 21, the two side edges that are opposite to each other in the second direction f2 of the region where the first bendable region BA1 and the first trace region SL1 overlap retract relative to the two side edges that are opposite to each other in the second direction f2 of the bending pattern 231. The dimension d1 of the retraction may, for example, be greater than or equal to 0.3 mm.

In some embodiments, as shown in FIG. 5, the first trace region SL1 includes a plurality of earthing lines 51 that are separated from each other and extend in the first direction f1, wherein the plurality of earthing lines 51 and the bending pattern 231 are connected via first via holes HL1.

As an example, as shown in FIG. 5, the plurality of earthing lines 51 are arranged in the second direction f2.

As an example, as shown in FIG. 5, the plurality of earthing lines 51 are connected to the bending pattern 231 via different first via holes HL1.

As an example, as shown in FIG. 3, in the orthographic projections on the substrate 21, the first via holes HL1 are disposed within the middle of the region of the bending pattern 231 in the first direction f1.

Figure 7:
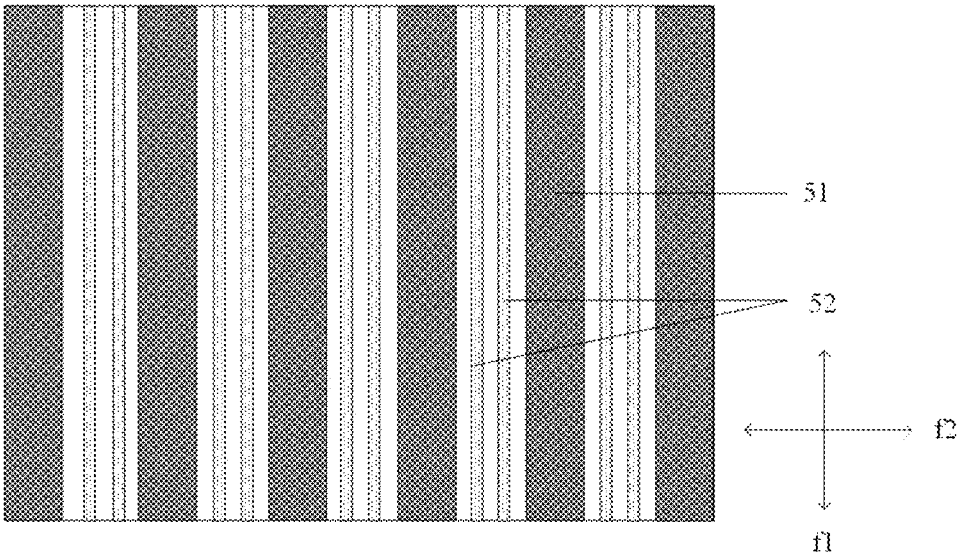
FIG. 7 exemplarily shows a local circuit layout diagram of a first trace region.

In some embodiments, as shown in FIG. 5 or FIG. 7, the first trace region SL1 further includes a plurality of first signal lines 52 that are separated from each other and extend in the first direction f1, each of the plurality of first signal lines 52 is located between two neighboring earthing lines 51, and at least one of the first signal lines 52 is disposed between the two neighboring earthing lines 51.

As an example, as shown in FIG. 5 or FIG. 7, the plurality of first signal lines 52 are arranged in the second direction f2.

As an example, as shown in FIG. 7, two first signal lines 52 are disposed between the two neighboring earthing lines 51.

In some embodiments, the plurality of first signal lines 52 include a low-voltage differential-signal line.

In order to ensure the signal quality of the display screen, the first trace region SL1 including the low-voltage differential-signal line is located within the middle region of the first metal layer 22. As shown in FIG. 2, FIG. 3 or FIG. 5, both of the left side and the right side of the first trace region SL1 are provided with the second trace region SL2.

In some embodiments, as shown in FIG. 2, FIG. 3 or FIG. 6, the second metal layer 23 includes two first openings 232, and the two first openings 232 are located at different sides of the bending pattern 231.

As shown in FIG. 2, FIG. 3 or FIG. 6, the first bendable region BA1 is divided into three regions arranged in the second direction f2, wherein the region in the middle is provided with the bending pattern 231, and the other two regions are provided with the first opening 232, and the first openings 232 are located at the left side and the right side of the bending pattern 231.

In some embodiments, as shown in FIG. 2, FIG. 3 or FIG. 6, the two first openings 232 and the bending pattern 231 are arranged in the second direction f2, and the dimensions in the second direction f2 of the two first openings 232 are unequal.

Certainly, the dimensions in the second direction f2 of the two first openings 232 may also be equal.

As an example, as shown in any one of FIGS. 2 to 4 and 6, the plurality of bendable regions BA further include a second bendable region BA2.

In some embodiments, as shown in any one of FIGS. 2, 3 and 6, the second metal layer 23 further includes: a second opening 233 located within the second bendable region BA2, wherein the orthographic projection on the substrate 21 of the second opening 233 overlaps with both of the orthographic projection on the substrate 21 of the first trace region SL1 and the orthographic projection on the substrate 21 of the second trace region SL2.

As shown in FIG. 4, the second opening 233 is a through hole that extends throughout the second metal layer 23 in a direction from the substrate 21 pointing to the second metal layer 23.

In the present embodiment, by disposing the second opening 233 within the region where the second bendable region BA2 overlaps with the first trace region SL1 and the second trace region SL2, a structure of a single copper layer is formed within the overlapping region, which ensures that the second bendable region BA2 has good flexibility and easy bendability, thereby problems such as light leakage in the black frame that might be caused by the bending can be prevented, and the normal displaying in the bending state is ensured.

In some embodiments, as shown in FIG. 2, a width in the first direction f1 of the bending pattern 231 is greater than a width in the first direction f1 of the second opening 233, and a width in the first direction f1 of the bending pattern 231 is equal to the width in the first direction f1 of the first opening 232.

By disposing the second opening 233 within the second bendable region BA2, a structure of a single copper layer is formed within the region of the second opening 233. The second opening 233 has a relatively low width in the first direction f1, thereby the affection on the signal transmission is reduced.

In some embodiments, as shown in FIG. 3 or FIG. 5, the first trace region SL1 includes: first leads PIN1 close to a first side edge of the first trace region SL1 and configured for bonding a display panel; and second leads PIN2 close to a second side edge of the first trace region SL1 and configured for bonding a printed circuit board. The first side edge and the second side edge are two side edges of the first trace region SL1 that are opposite to each other in the first direction f1.

As an example, as shown in FIG. 3 or FIG. 5, the first side edge is the upper edge of the first trace region SL1, and the second side edge is the lower edge of the first trace region SL1.

As an example, as shown in FIG. 3 or FIG. 5, a plurality of first leads PIN1 are arranged in the second direction f2, and a plurality of second leads PIN2 are arranged in the second direction f2.

In some embodiments, as shown in FIG. 3, the bending pattern 231 is located at the side of the second bendable region BA2 away from the first leads PIN1. In other words, the bending pattern 231 is located between the second bendable region BA2 and the second leads PIN2, in this way, the distance between the bending pattern 231 and the display panel can be increased, the problem of light leakage in the black frame that might be caused by the disposing of double copper layers within the bendable regions closer to the display panel is avoided.

In some embodiments, the bending pattern 231 is a grid pattern. In this way, the flexibility and the easy bendability of the first bendable region BA1 can be improved, and displaying abnormality caused by the bending is avoided.

It should be noted that the bending pattern 231 may also be a solid pattern, which can reduce the impedance of the second metal layer 23.

In some embodiments, as shown in FIG. 3, the flexible circuit board further includes a planarizing region PA located at at least one side of the bendable regions BA. The planarizing region PA may, for example, be the region of the flexible circuit board other than the bendable regions BA.

As an example, as shown in FIG. 3, the planarizing region PA may include: a first bonding region PA1 located at the side of the second bendable region BA2 away from the first bendable region BA1; a second planarizing region PA2 located between the second bendable region BA2 and the first bendable region BA1; a third planarizing region PA3 located at the side of the first bendable region BA1 away from the second bendable region BA2; and a second bonding region PA4 located at the side of the third planarizing region PA3 away from the second bendable region BA2.

In some embodiments, as shown in FIG. 3, the second metal layer 23 further includes a planarizing pattern 234 located within the planarizing region PA, wherein the planarizing pattern 234 and the bending pattern 231 are connected to each other and are of an integral structure, and the planarizing pattern 234 is connected to the earthing lines in the first metal layer 22 via the second via holes HL2.

The earthing lines connected to the planarizing pattern 234 may be located within the first trace region SL1, and may also be located within the second trace region SL2.

As an example, in the orthographic projections on the substrate 21, the planarizing pattern 234 may fully fill the planarizing region PA, or be disposed within a part of the planarizing region PA (as shown in FIG. 3), which is not limited in the present disclosure.

As an example, as shown in FIG. 3, in the orthographic projections on the substrate 21, the planarizing pattern 234 does not overlap with the first bonding region PA1 and the second bonding region PA4, and fully fills the second planarizing region PA2 and the third planarizing region PA3.

As an example, the planarizing pattern 234 and the bending pattern 231 are of the same structure and are of a grid structure or a solid structure.

As an example, as shown in FIG. 3, the same earthing line may be connected to the planarizing pattern 234 via a plurality of second via holes HL2.

In practical usage, the display panel releases static electricity, which causes the displaying signal to become unstable and have fluctuating qualities, to affect the effect of displaying, to result in imperfects such as abnormal frames, vertical-line imperfect, interference, shutting-down and breakdown. Furthermore, the static-electricity releasing cannot be detected in advance, and can merely be found during usage. Therefore, the static-electricity protection is important in the design of display products.

In order to realize the static-electricity protection, in some embodiments, as shown in FIG. 3 or FIG. 6, the planarizing pattern 234 includes a first conducting pattern 61 configured for connecting to an earth potential. Furthermore, the orthographic projection on the substrate 21 of the first conducting pattern 61 is located within the area of the orthographic projection on the substrate 21 of the second trace region SL2, and does not overlap with orthographic projections on the substrate 21 of the second via holes HL2.

As an example, as shown in FIG. 3, in the orthographic projections on the substrate 21, the first conducting pattern 61 does not overlap with the plurality of bendable regions BA, the first trace region SL1, the first bonding region PA1 and the second bonding region PA4.

As an example, as shown in FIG. 3, the first conducting pattern 61 is located at the side of the plurality of bendable regions BA that is close to the second leads PIN2. In other words, the first conducting pattern 61 is located between the plurality of bendable regions BA and the second leads PIN2.

As an example, the first conducting pattern 61 is an exposed area in the planarizing pattern 234, and is used for connecting to the back plate of the displaying module by using a conducting adhesive tape, to realize the earthing, thereby the static electricity generated by the display panel can be conducted away, adverse risks that might be caused by the static electricity can be prevented, the stability in the displaying is improved, and the effect of displaying is improved. At the same time, quick flowing-back of the noise signal can be realized, thereby leakage and interference of the noise signal is prevented and the effect of the electrostatic shielding is improved.

As an example, as shown in FIG. 3 or FIG. 6, the first conducting pattern 61 may, for example, be rectangular, and the dimensions of the rectangle are 8 mm×3 mm.

In some embodiments, as shown in FIG. 3 or FIG. 6, the second metal layer 23 includes a plurality of first conducting patterns 61, the plurality of first conducting patterns 61 are located at two sides of the first trace region SL1, and the plurality of first conducting patterns 61 are arranged in the second direction f2.

By disposing the plurality of first conducting patterns 61 connected to the earth potential, the static electricity of the different regions can be conducted away, to prevent imperfects such as abnormal displaying caused by local static-electricity accumulation.

As an example, the substrate 21 is a polyimide thin film with the thickness being, for example, 25 micrometers.

As an example, both of a material of the first metal layer 22 and a material of the second metal layer 23 are copper foils with the thickness being, for example, ⅓ OZ.

As an example, as shown in FIG. 4, the flexible circuit board may further include a first adhesively bonding layer 24 and a first protecting film 25 that are arranged in layer configuration at the side of the first metal layer 22 away from the substrate 21, and the first adhesively bonding layer 24 is located between the first metal layer 22 and the first protecting film 25. The flexible circuit board may further include: a gold plating layer 28, and the gold plating layer 28 covers the first leads PIN1 and the second leads PIN2.

As an example, as shown in FIG. 4, the flexible circuit board may further include a second adhesively bonding layer 26 and a second protecting film 27 that are sequentially arranged in layer configuration at the side of the second metal layer 23 away from the substrate 21, and the second adhesively bonding layer 26 is located between the second metal layer 23 and the second protecting film 27. The second adhesively bonding layer 26 and the second protecting film 27 may be removed within the bendable regions BA.

As an example, the thickness of the first adhesively bonding layer 24 and the thickness of the second adhesively bonding layer 26 are, for example, 15 micrometers.

As an example, the first protecting film 25 and the second protecting film 27 are, for example, 12.5-micrometer polyimide thin films.

As an example, a width W1 in the second direction f2 of the first trace region SL1 may be obtained by calculation by using the formula of W1=W0×X=(10×M+5×N+6×O+10×P)×X.

As shown in FIG. 7, M is the line width of the first signal lines 52, for example, 0.06 mm-0.09 mm. N is the spacing between the two neighboring first signal lines 52, for example, 0.09 mm. O is the line width of the earthing lines 51, for example, 0.3 mm-0.35 mm. P is the spacing between the neighboring first signal line 52 and the earthing line 51, for example, 0.06 mm-0.075 mm. W0 is the width in the second direction f2 of one trace unit, and X is the quantity of the trace units included by the first trace region SL1. FIG. 7 shows one trace unit. The first trace region SL1 may include one trace unit, and may also include a plurality of (for example, two) trace units arranged in the second direction f2, which is not limited in the present disclosure.

As an example, the width W0 in the second direction f2 of the trace unit may, for example, be 4 mm.

One trace unit shown in FIG. 7 includes 5 groups of the first signal lines 52 and 6 earthing lines 51. The first trace region SL1 including two trace units may, for example, include 10 groups of the first signal lines 52 and 11 earthing lines 51. Each of the groups includes two first signal lines 52.

Figure 8:
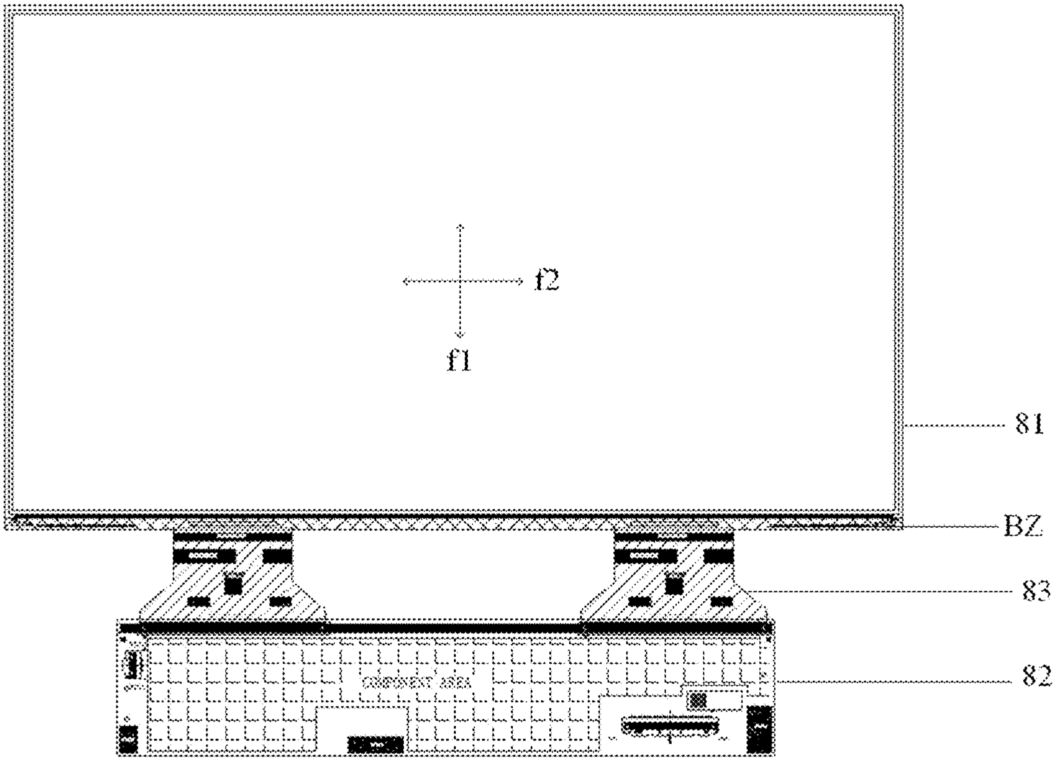
FIG. 8 exemplarily shows a schematic structural diagram of a displaying module according to the present disclosure in an un-bending state.

A displaying module is provided by the present disclosure. As shown in FIG. 8, the displaying module includes: a display panel 81, and a flexible circuit board 83 according to any one of the above embodiments, wherein the first metal layer 22 of the flexible circuit board 83 is bonding-connected to the display panel 81.

A person skilled in the art can understand that the displaying module according to the present disclosure has the advantages of the above-described flexible circuit board 83.

In some embodiments, as shown in FIG. 8, the displaying module further includes a printed circuit board 82, and the printed circuit board 82 is bonding-connected to the first metal layer 22 of the flexible circuit board 83.

As an example, the display panel 81 is bonding-connected to the first metal layer 22 located within the first bonding region PA1, and the first metal layer 22 located within the first bonding region PA1 includes the first leads PIN1.

As an example, the printed circuit board 82 is bonding-connected to the first metal layer 22 located within the second bonding region PA4, and the first metal layer 22 located within the second bonding region PA4 includes the second leads PIN2.

Figure 9:
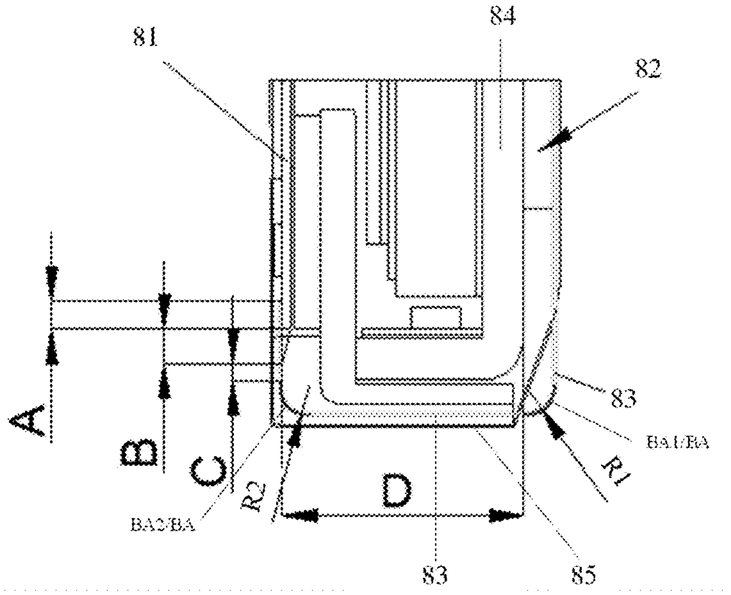
FIG. 9 exemplarily shows a schematic structural diagram of a displaying module according to the present disclosure in the bending state.

FIG. 8 shows the displaying module in the un-bending state. Referring to FIG. 9, FIG. 9 shows the displaying module in the bending state.

In some embodiments, as shown in FIG. 9, the plurality of bendable regions BA further include a second bendable region BA2, and both of the first bendable region BA1 and the second bendable region BA2 are in the bending state, so that the printed circuit board 82 is located at the side of the display panel 81 away from the light-exiting surface.

In some embodiments, as shown in FIG. 9, the bending radius R1 of the first bendable region BA1 is greater than or equal to the bending radius R2 of the second bendable region BA2.

In some embodiments, the bending radius R1 of the bending pattern 231 is greater than or equal to the bending radius R2 of the second bendable region BA2.

In some embodiments, as shown in FIG. 9, the displaying module may further include a back plate 84, and when the first bendable region BA1 and the second bendable region BA2 are in the bending state, the back plate 84 is located between the display panel 81 and the printed circuit board 82.

In some embodiments, as shown in FIG. 6, the second metal layer 23 further includes a first conducting pattern 61 configured for connecting to an earth potential. As shown in FIG. 9, the displaying module further includes: a first conducting adhesive tape 85, wherein the first conducting adhesive tape 85 is located at the side of the flexible circuit board 83 that is close to the second metal layer 23, and an adhesive surface of the first conducting adhesive tape faces the second metal layer 23. By disposing the first conducting adhesive tape 85, electromagnetic shielding can be performed to the flexible circuit board 83.

Figure 10:
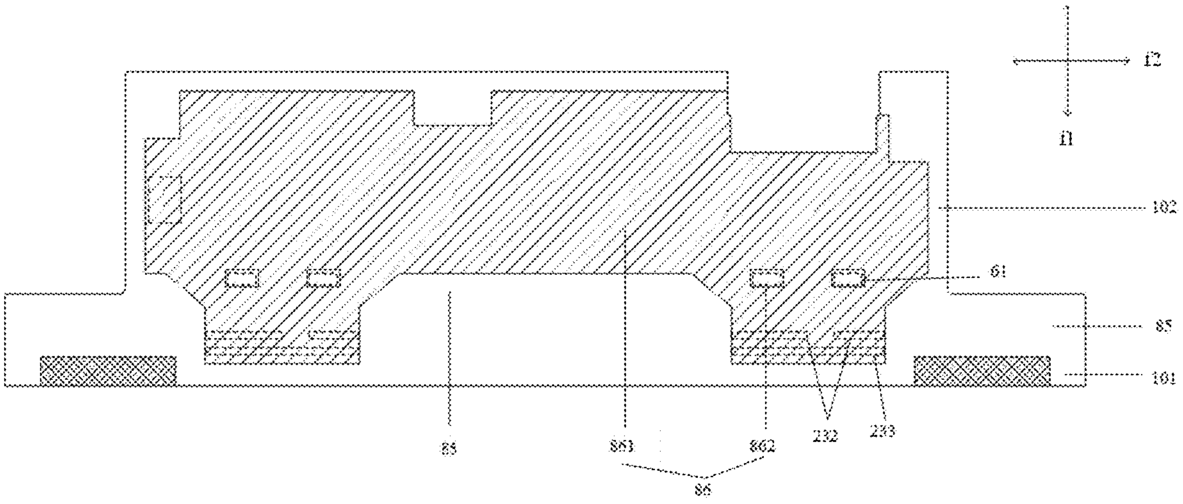
FIG. 10 exemplarily shows a schematic planar structural diagram of an integral conducting adhesive tape and an insulating film.

In the present embodiment, as shown in FIG. 10, the displaying module further includes: an insulating film 86 adhesively bonded to the adhesive surface of the first conducting adhesive tape 85, wherein the insulating film 86 includes an insulating pattern 861 and a third opening 862, the orthographic projection on the substrate 21 of the insulating pattern 861 covers at least the orthographic projection on the substrate 21 of the first opening 232 and the orthographic projection on the substrate 21 of the second opening 233, and the orthographic projection on the substrate 21 of the third opening 862 covers the orthographic projection on the substrate 21 of the first conducting pattern 61.

The surface of the insulating film 86 away from the first conducting adhesive tape 85 has no adhesive. The third opening 862 is a through hole that extends throughout the insulating film 86 in a direction of the film thickness of the insulating film 86.

By configuring that the insulating pattern 861 covers at least the first opening 232 and the second opening 233, it can be prevented that the first conducting adhesive tape 85 and the flexible circuit board 83 within the region of the single copper layer (i.e., the region that corresponds to the first opening 232 and the second opening 233) are adhesively bonded together, to reduce the risk in tearing of the flexible circuit board 83 under a heavy force.

By disposing the third opening 862, the adhesive surface of the first conducting adhesive tape 85 and the first conducting pattern 61 are adhesively bonded to each other, and the first conducting adhesive tape 85 can realize the connection between the first conducting pattern 61 and the earth potential.

As an example, as shown in FIG. 10, the edge of the orthographic projection on the substrate 21 of the third opening 862 extends outwardly beyond the edge of the orthographic projection on the substrate 21 of the first conducting pattern 61, and the dimension of the extension is greater than or equal to 2 mm.

In some embodiments, as shown in FIG. 8, the display panel 81 includes a first border frame BZ, and the first metal layer 22 is connected to a lead located inside the first border frame BZ.

In some embodiments, as shown in FIG. 10, the displaying module further includes: a second conducting adhesive tape 101, wherein the second conducting adhesive tape 101 is located at one side of the first border frame BZ, and an adhesive surface of the second conducting adhesive tape faces the first border frame BZ; and a third conducting adhesive tape 102, wherein the third conducting adhesive tape 102 is located at the side of the printed circuit board 82 that is close to an element component, and an adhesive surface of the third conducting adhesive tape faces the element component.

As an example, the edge of the second conducting adhesive tape 101 that is close to the displaying region of the display panel 81 may flush with the edge of the polarizer.

The third conducting adhesive tape 102 is used for lap-joining both of the printed circuit board 82 and the back plate 84, to realize the earthing of the printed circuit board 82. The third conducting adhesive tape 102 is further used for performing electromagnetic shielding to the element components on the printed circuit board 82.

In some embodiments, as shown in FIG. 10, the first conducting adhesive tape 85, the second conducting adhesive tape 101 and the third conducting adhesive tape 102 are of an integral structure, the insulating film 86 extends to the adhesive surface of the third conducting adhesive tape 102, and the orthographic projection on the substrate 21 of the insulating film 86 covers the orthographic projection on the substrate 21 of the element component.

By configuring that the first conducting adhesive tape 85, the second conducting adhesive tape 101 and the third conducting adhesive tape 102 are an integral conducting adhesive tape, the process steps can be simplified, and the production efficiency is increased. Moreover, the integral conducting adhesive tape can increase the efficiency of the static-electricity releasing. In addition, by configuring that the insulating film 86 covers the element components on the printed circuit board 82, burning-out of the electronic element components can be prevented.

As an example, as shown in FIG. 10, the integral conducting adhesive tape may simultaneously cover one or more flexible circuit boards. The integral conducting adhesive tape is, for example, a black light shielding adhesive tape.

As an example, the leads inside the first border frame BZ are panel leads, wherein the width of the panel leads is 0.12 mm, the spacing of the panel leads is 0.06 mm, the period of the panel leads is 0.18 mm, and the length of the panel leads is 0.7 mm.

Figure 11:
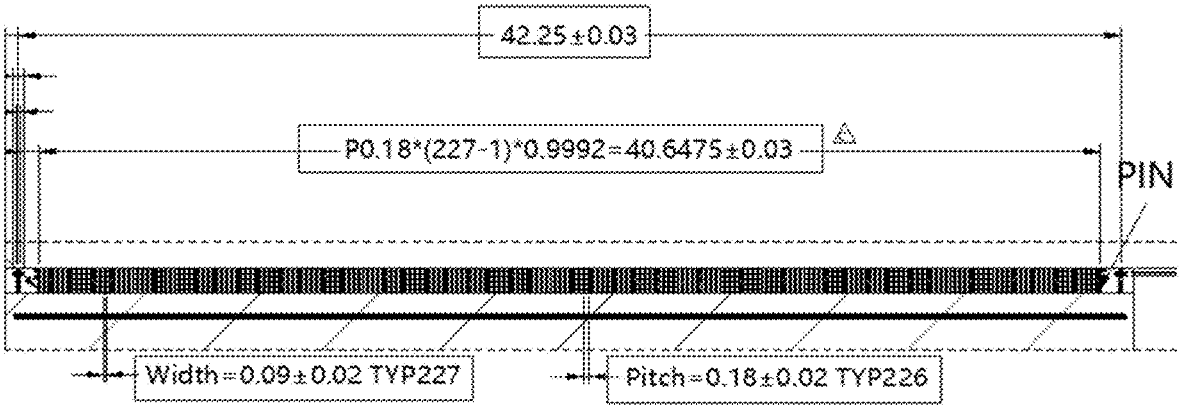
FIG. 11 exemplarily shows a schematic planar structural diagram of first leads.

As an example, as shown in FIG. 11, the width (Width shown in FIG. 11) of the first leads PIN1 is 0.09 mm, the spacing of the first leads PIN1 is 0.09 mm, the period (Pitch shown in FIG. 11) of the first leads PIN1 is 0.18 mm, and the length of the first leads PIN1 is 1 mm. In order to prevent insufficient contact due to aligning deviations, in the length direction of the first leads PIN1, the first leads PIN1 generally exceed the panel leads by at least 0.1 mm, and the first leads PIN1 exceed the edge of the display panel 81 by at least 0.2 mm.

In addition, in the fabrication of the first leads PIN1, the width of the first leads PIN1 may be preshrunk as compared with the width of the panel leads by 0.008%. Accordingly, in the bonding process, the first leads PIN1 can expand by the heating, and finally the width of the first leads PIN1 is made to be substantially equal to the width of the panel leads.

In order to reduce the risk in uniform displaying, the distance between the region where the flexible circuit board 83 starts the bending and the edge of the display panel 81 is greater than or equal to 1.6 mm.

Figure 12:
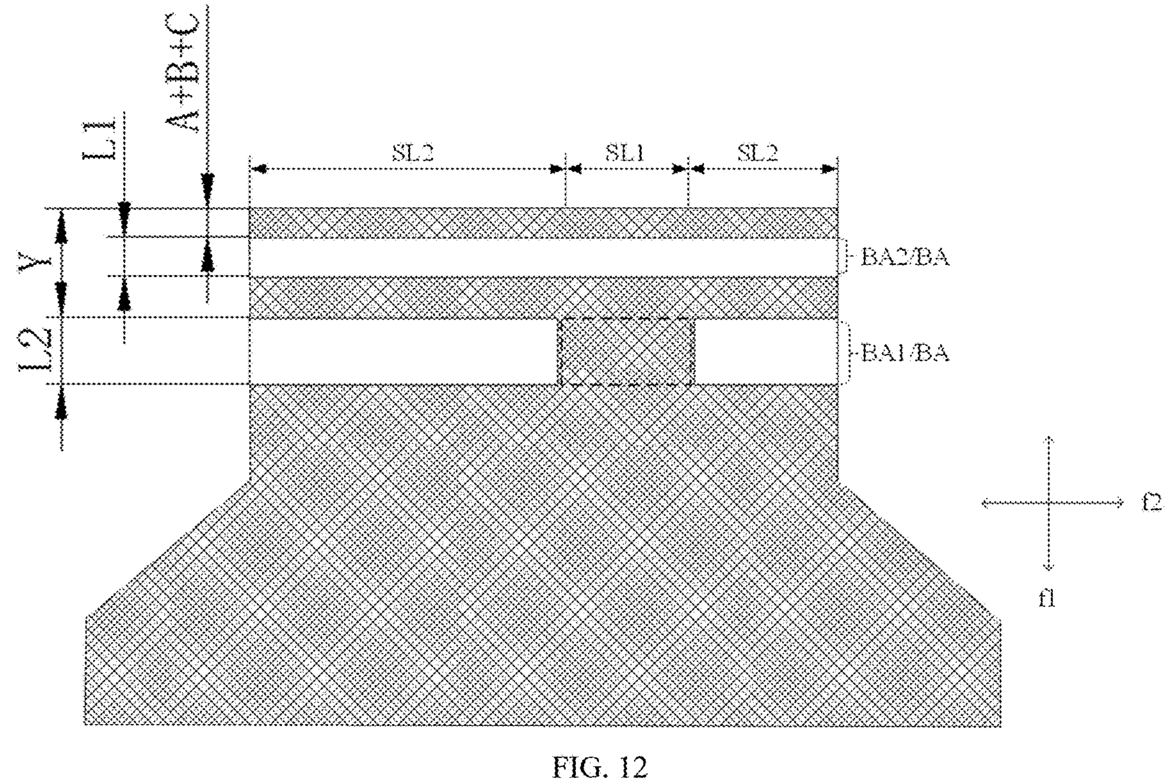
FIG. 12 exemplarily shows another schematic planar structural diagram of a flexible circuit board according to the present disclosure.

As an example, as shown in FIG. 9 or 12, the distance X between the first bendable region BA1 and a first edge (the upper edge shown in FIG. 12, i.e., the edge close to the display panel 81) of the flexible circuit board 83 is: X=A+B+C, wherein A is the dimension in the first direction f1 of the region where the flexible circuit board 83 covers the display panel 81, b is the width of the coating of the UV adhesive in the first direction f1, for example, less than or equal to 1.0 mm, and C is, for example, 0.3 mm.

As an example, as shown in FIG. 9 or 12, the width L1 in the first direction f1 of the second bendable region BA2 is: L1=2R2+1 mm, wherein R2 is the bending radius of the second bendable region BA2. In order to reduce the bending stress within the second bendable region BA2, and reduce the length in the first direction f1 of the flexible circuit board 83, a chamfering treatment may be performed to the plastic frame of the display panel 81 at a position close to the second bendable region BA2. R2 is, for example, 1 mm.

As an example, as shown in FIG. 9 or 12, the distance Y between the first bendable region BA1 and the first edge is: Y=A+B+C+D+H−1.5 mm, wherein D is the distance between the light-exiting surface of the display panel 81 and the surface of the back plate 84 away from the display panel 81, and H is the thickness of the printed circuit board 82 which is, for example, 0.8 mm.

As an example, as shown in FIG. 9 or FIG. 12, the width L2 in the first direction f1 of the first bendable region BA1 is: L2=2R1+2×1.5 mm, wherein R1 is the bending radius of the first bendable region BA1.

A displaying device is provided by the present disclosure, wherein the displaying device includes: the displaying module according to any one of the above embodiments; and a driving component connected to the displaying module and configured for driving the displaying module to display.

A person skilled in the art can understand that the displaying device according to the present disclosure has the advantages of the above-described displaying module.

The displaying device according to the present disclosure may be any product or component that has the function of displaying, such as a mobile phone, a tablet personal computer, a television set, a display, a notebook computer, a digital photo frame, an onboard displaying device, a vehicle, a smart watch, a body building wristband and a personal digital assistant.

In the present disclosure, the meaning of "plurality of" is "two or more", and the meaning of "at least one" is "one or more", unless explicitly and particularly defined otherwise.

In the present disclosure, the terms that indicate orientation or position relations, such as "upper" and "lower", are based on the orientation or position relations shown in the drawings, and are merely for conveniently describing the present disclosure and simplifying the description, rather than indicating or implying that the device or element must have the specific orientation and be constructed and operated according to the specific orientation. Therefore, they should not be construed as a limitation on the present disclosure.

In the present text, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "including a . . . " does not exclude additional same element in the process, method, article or device including the element.

The "one embodiment", "some embodiments", "exemplary embodiments", "one or more embodiments", "example", "one example" or "some examples" as used herein are intended to indicate that specific features, structures, materials or characteristics related to the embodiment or example are included in at least one embodiment or example of the present disclosure. The illustrative indication of the above terms does not necessarily refer to the same one embodiment or example. Moreover, the specific features, structures, materials or characteristics may be included in any one or more embodiments or examples in any suitable manner.

In the present text, relation terms such as first and second are merely intended to distinguish one entity or operation from another entity or operation, and that does not necessarily require or imply that those entities or operations have therebetween any such actual relation or order.

In the description on some embodiments, "couple" and "connect" may be used. For example, in the description on some embodiments, the term "connect" may be used to indicate that two or more components directly physically contact or electrically contact each other. As another example, in the description on some embodiments, the term "couple" may be used to indicate that two or more components directly physically contact or electrically contact each other. However, the term "couple" or "communicatively couple" may also indicate that two or more components do not directly contact each other, but still cooperate with each other or act on each other. The embodiments disclosed herein are not necessarily limited by the contents herein.

"At least one of A, B and C" and "at least one of A, B or C" have the same meaning, and both of them include the following combinations of A, B and C: solely A, solely B, solely C, the combination of A and B, the combination of A and C, the combination of B and C, and the combination of A, B and C.

"A and/or B" include the following three combinations: solely A, solely B, and the combination of A and B.

As used herein, with reference to the context, the term "if" is optionally interpreted as meaning "when" or "in response to determining that" or "in response to detecting that". Similarly, with reference to the context, the phrase "if it has been determined that" or "if the stated condition or event has been detected" is optionally interpreted as referring to "when it has been determined that" or "in response to determining . . . " or "when the stated condition or event has been detected" or "in response to the stated condition or event having been detected".

The "for" or "configured for" as used herein is intended as opened and inclusive languages, and does not exclude apparatuses adapted for or configured for executing additional tasks or steps.

The "based on" or "according to" as used herein means opening and inclusive. The processes, steps, calculations or other actions based on one or more conditions or values may be based on other conditions or exceed the values in practice. The processes, steps, calculations or other actions according to one or more conditions or values may be according to other conditions or exceed the values in practice.

As used herein, “about”, “substantially” or “approximately” includes the described value and the average value within an acceptable deviation range of the particular value, wherein the acceptable deviation range is decided by the discussed measurement that a person skilled in the art has taken into consideration and the error relevant to the measurement on the specific quantity (i.e., the limitation of the measuring system).

As used herein, “parallel”, “perpendicular”, “equal” and “flushing” include the described case and cases similar to the described case, wherein the range of the similar cases is within an acceptable deviation range, wherein the acceptable deviation range is decided by the discussed measurement that a person skilled in the art has taken into consideration and the error relevant to the measurement on the specific quantity (i.e., the limitation of the measuring system). For example, “parallel” includes absolute parallelism and approximate parallelism, wherein the acceptable deviation range of the approximate parallelism may, for example, be deviations within 5°. “Perpendicular” includes absolute perpendicularity and approximate perpendicularity, wherein the acceptable deviation range of the approximate perpendicularity may also, for example, be deviations within 5°. “Equal” includes absolute equality and approximate equality, wherein the acceptable deviation range of the approximate equality may, for example, be that the difference between the two equal instances is less than or equal to 5% of any one of them. “Flushing” includes absolute flushing and approximate flushing, wherein the acceptable deviation range of the approximate flushing may, for example, be that the distance between the two flushing instances is less than or equal to 5% of the dimension of any one of them.

It should be understood that, when a layer or element is described as on another layer or a base board, the layer or element may be directly on the other layer or the base board, or an intermediate layer may also exist between the layer or element and the another layer or the base board.

The exemplary embodiments are described herein with reference to sectional views and/or plan views as idealized illustrative figures. In the drawings, in order for clarity, the thicknesses of the layers and the regions are exaggerated. Therefore, alterations from the shapes of the figures as the result of, for example, fabricating techniques and/or tolerances can be envisaged. Therefore, the exemplary embodiments should not be interpreted as limited to the shapes of the regions shown herein, but should include the shape deviations caused by, for example, fabrication. For example, an etching region illustrated as rectangular generally has a curved feature. Therefore, the regions shown in the drawings are essentially illustrative, and their shapes are not intended to illustrate the practical shapes of the regions of the device, and are not intended to limit the scopes of the exemplary embodiments.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A flexible circuit board, comprising a plurality of bendable regions that are arranged in a first direction and are separated from each other, a bending axis of each of the plurality of bendable regions extends in a second direction, the plurality of bendable regions comprise a first bendable region, and the flexible circuit board comprises:

a substrate;

a first metal layer located at one side of the substrate and comprising a first trace region and a second trace region that extend in the first direction and are arranged in the second direction; and a second metal layer located at one side of the substrate away from the first metal layer and comprising a bending pattern and a first opening that are located within the first bendable region;

wherein an orthographic projection on the substrate of the bending pattern and an orthographic projection on the substrate of the first trace region overlap, and an orthographic projection on the substrate of the first opening and an orthographic projection on the substrate of the second trace region overlap-;

wherein the plurality of bendable regions further comprise a second bendable region, and the second metal layer further comprises:

a second opening located within the second bendable region, wherein an orthographic projection on the substrate of the second opening overlaps with both of the orthographic projection on the substrate of the first trace region and the orthographic projection on the substrate of the second trace region.

2. The flexible circuit board according to claim 1, wherein a region where an orthographic projection on the substrate of the first bendable region and the orthographic projection on the substrate of the first trace region overlap with each other is located within an area of the orthographic projection on the substrate of the bending pattern.

3. The flexible circuit board according to claim 1, wherein the first trace region comprises:

a plurality of earthing lines that are separated from each other and extend in the first direction, wherein the plurality of earthing lines and the bending pattern are connected via first via holes.

4. The flexible circuit board according to claim 1, wherein the second metal layer comprises two first openings, and the two first openings are located at different sides of the bending pattern.

5. The flexible circuit board according to claim 1, wherein a width in the first direction of the bending pattern is greater than a width in the first direction of the second opening, and the width in the first direction of the bending pattern is equal to a width in the first direction of the first opening.

6. The flexible circuit board according to claim 1, wherein the first trace region comprises:

first leads close to a first side edge of the first trace region and configured for bonding a display panel; and second leads close to a second side edge of the first trace region and configured for bonding a printed circuit board;

wherein the first side edge and the second side edge are two side edges of the first trace region that are opposite to each other in the first direction, and the bending pattern is located at one side of the second bendable region away from the first leads.

7. The flexible circuit board according to claim 1, wherein the flexible circuit board further comprises a planarizing region located at at least one side of the plurality of bendable regions; and the second metal layer further comprises a planarizing pattern located within the planarizing region, the planarizing pattern and the bending pattern are connected to each other and are of an integral structure, and the planarizing pattern is connected to earthing lines in the first metal layer via second via holes.

8. The flexible circuit board according to claim 1, wherein the bending pattern is a grid pattern.

9. A displaying module, comprising:

a display panel, and the flexible circuit board according to claim 1, wherein the first metal layer of the flexible circuit board is bonding-connected to the display panel.

10. The flexible circuit board according to claim 3, wherein the first trace region further comprises:

a plurality of first signal lines that are separated from each other and extend in the first direction, each of the plurality of first signal lines is located between two neighboring earthing lines, and at least one of the first signal lines is disposed between the two neighboring earthing lines.

11. The flexible circuit board according to claim 4, wherein the two first openings and the bending pattern are arranged in the second direction, and dimensions in the second direction of the two first openings are unequal.

12. The flexible circuit board according to claim 7, wherein the planarizing pattern comprises a first conducting pattern configured for connecting to an earth potential; and an orthographic projection on the substrate of the first conducting pattern is located within an area of the orthographic projection on the substrate of the second trace region, and does not overlap with orthographic projections on the substrate of the second via holes.

13. The displaying module according to claim 9, wherein the displaying module further comprises a printed circuit board bonding-connected to the first metal layer of the flexible circuit board;

both of the first bendable region and the second bendable region are in a bending state, so that the printed circuit board is located at one side of the display panel away from a light-exiting surface; and a bending radius of the bending pattern is greater than or equal to a bending radius of the second bendable region.

14. The displaying module according to claim 13, wherein the second metal layer further comprises a first conducting pattern configured for connecting to an earth potential; and the displaying module further comprises:

a first conducting adhesive tape, wherein the first conducting adhesive tape is located at one side of the flexible circuit board close to the second metal layer, and an adhesive surface of the first conducting adhesive tape faces the second metal layer; and an insulating film adhesively bonded to the adhesive surface of the first conducting adhesive tape, wherein the insulating film comprises an insulating pattern and a third opening, an orthographic projection on the substrate of the insulating pattern covers at least an orthographic projection on the substrate of the first opening and an orthographic projection on the substrate of the second opening, and an orthographic projection on the substrate of the third opening covers an orthographic projection on the substrate of the first conducting pattern.

15. The flexible circuit board according to claim 10, wherein the plurality of first signal lines comprise a low-voltage differential-signal line.

16. The flexible circuit board according to claim 12, wherein the first metal layer further comprises second leads configured for bonding a printed circuit board; and the first conducting pattern is located at one side of the plurality of bendable regions that is close to the second leads.

17. The flexible circuit board according to claim 12, wherein the second metal layer comprises a plurality of first conducting patterns, the plurality of first conducting patterns are located at two sides of the first trace region, and the plurality of first conducting patterns are arranged in the second direction.

18. The displaying module according to claim 14, wherein the display panel comprises a first border frame, and the first metal layer is connected to a lead located inside the first border frame;

the displaying module further comprises:

a second conducting adhesive tape, wherein the second conducting adhesive tape is located at one side of the first border frame, and an adhesive surface of the second conducting adhesive tape faces the first border frame; and a third conducting adhesive tape, wherein the third conducting adhesive tape is located at one side of the printed circuit board close to an element component, and an adhesive surface of the third conducting adhesive tape faces the element component;

wherein the first conducting adhesive tape, the second conducting adhesive tape and the third conducting adhesive tape are of an integral structure, the insulating film extends to the adhesive surface of the third conducting adhesive tape, and an orthographic projection on the substrate of the insulating film covers an orthographic projection on the substrate of the element component.

19. A displaying device, wherein the displaying device comprises:

the displaying module according to claim 9; and a driving component connected to the displaying module and configured for driving the displaying module to display.

* * * * *